United States Patent [19]

Iranmanesh

[11] Patent Number: 4,621,414

[45] Date of Patent: Nov. 11, 1986

[54] METHOD OF MAKING AN ISOLATION SLOT FOR INTEGRATED CIRCUIT STRUCTURE

[75] Inventor: Ali Iranmanesh, Mountain View, Calif.

[73] Assignee: Advanced Micro Devices, Inc., Sunnyvale, Calif.

[21] Appl. No.: 707,728

[22] Filed: Mar. 4, 1985

[51] Int. Cl.$^4$ .................. H01L 21/31; H01L 21/302; H01L 21/76

[52] U.S. Cl. .................................. 29/576 W; 29/580; 148/DIG. 50; 357/49; 427/93

[58] Field of Search ............................. 29/576 W, 580; 148/DIG. 50; 357/49; 427/93; 156/643

[56] References Cited

U.S. PATENT DOCUMENTS 4,353,086 10/1982 Jaccodine et al. ............... 29/576 W
4,542,396 9/1985 Schutten et al. .................. 357/23.8
4,554,728 11/1985 Shepard .......................... 29/576 W

FOREIGN PATENT DOCUMENTS 199553 11/1983 Japan .................................. 156/643

OTHER PUBLICATIONS

Tsang, "Buried-Gate Electrically Alterable Memory Device", I.B.M. Tech. Discl. Bulletin 24, (3), 8/81.

Primary Examiner—Brian E. Hearn
Assistant Examiner—John T. Callahan
Attorney, Agent, or Firm—Patrick T. King; John P. Taylor; J. Vincent Tortolano

[57] ABSTRACT

The invention comprises an improved isolation slot in an integrated circuit structure which minimizes damage to the silicon substrate. The improved isolation slot is formed by etching a slot in the substrate of an integrated circuit structure; depositing a buffer layer in the slot adjacent the walls of the slot; and forming an isolation oxide layer in the slot over the buffer layer; whereby the presence of the buffer layer between the substrate and the isolation oxide minimizes damage to the substrate by the oxide. In a preferred embodiment, the buffer layer comprises polysilicon which is partially oxidized to form the isolation oxide layer. A barrier layer is formed between the slot walls and the polysilicon buffer layer to electrically insulate the polysilicon from the adjoining integrated circuit structure.

19 Claims, 6 Drawing Figures

METHOD OF MAKING AN ISOLATION SLOT FOR INTEGRATED CIRCUIT STRUCTURE

BACKGROUND OF THE INVENTION

1. Field of the Invention

This invention relates to integrated circuit structures and more particularly to improvements in an isolation slot formed in an integrated circuit structure to electrically isolate adjacent active devices in the structure.

2. Description of the Prior Art

Isolation slots are formed in a single crystal silicon substrate of an integrated circuit structure to electrically isolate adjacent active devices in the structure. The formation of such an isolation slot is generally described in Bondur et al U.S. Pat. No. 4,104,086. Generally, the slot is formed by etching the silicon substrate and then oxidizing the silicon walls of the slot to form an oxide layer which functions as the electrically insulating isolation material. The remainder of the slot is then filled with any convenient filler material, such as polysilicon or vapor deposited silicon dioxide, and the structure is then planarized.

The thickness of the sidewall oxide layer in the slot determines the value of the device capacitance to the substrate, e.g., the collector to substrate capacitance in a bipolar transistor. Therefore, it is desirable to provide a thick isolation oxide layer, e.g., greater than 3000 Angstroms.

However, it has been observed that a slot oxidation step, involving formation of an oxide thickness of as much as 3000–5000 Angstroms or more may, cause propagation of damages to the silicon substrate, such as dislocations. When such damage reaches the active area of adjacent transistors, the resultant potential for damage will have a noticeable effect on yield of dies from a wafer. For example, in bipolar transistor technology, damage to the substrate by formation of isolation oxidation on the sidewalls of an isolation slot can cause shorts between collectors and emitters, particularly when thick layers of isolation oxide are formed, i.e., 3000 Angstroms or more.

It has been proposed, in IBM Technical Disclosure Bulletin, Vol. 20, No. 8, January 1978, to reduce such stresses by reducing the oxide thickness and increasing the oxide temperature. However, reduction of the oxide thickness, while possibly reducing the stress, does not enhance the desired isolation characteristics of the slot.

It, therefore, would be desirable to form an isolation slot having a much thicker oxide layer to reduce the device capacitance without the occurrence of damage to the adjoining integrated circuit structure.

SUMMARY OF THE INVENTION

It is therefore an object of this invention to provide an improved isolation slot in an integrated circuit structure which minimizes damage to the adjoining structure.

It is another object of this invention to provide an improved isolation slot in an integrated circuit structure which minimizes damage to the adjoining structure by providing a buffer layer between the sidewalls of the slot and a layer of isolation oxide formed in the slot.

It is yet another object of this invention to provide an improved isolation slot in an integrated circuit structure wherein a barrier layer is first formed on the walls of the slot and then a buffer layer of polysilicon is formed between the barrier layer and the isolation oxide layer.

In accordance with the invention, an improved isolation slot to electrically separate active devices in an integrated circuit structure comprises a slot having a buffer layer therein between the walls of the slot and a layer of isolation oxide therein to provide compensation for thermal mismatch between the silicon substrate of the integrated circuit structure and the silicon oxide isolation layer. In a preferred embodiment, a barrier layer is first formed on the walls of the slot, a polysilicon buffer layer is deposited over the barrier layer, and the polysilicon is partially oxidized to form the isolation oxide layer.

DESCRIPTION OF THE PREFERRED EMBODIMENTS

Figure 1:
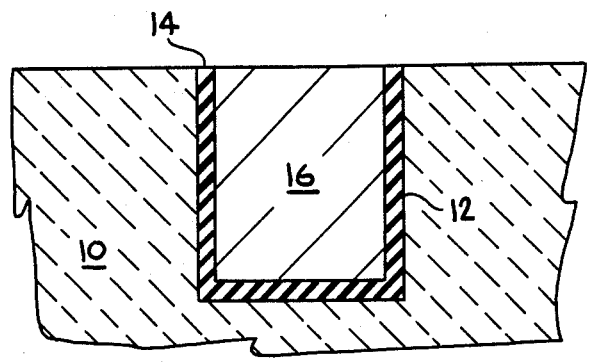
FIG. 1 is a fragmentary vertical cross-sectional view illustrating a prior art structure.

FIG. 1 illustrates an isolation slot in an integrated circuit structure constructed in accordance with the prior art in which an isolation oxide layer 14 is formed by direct oxidation of the slot walls 12 of the single crystal silicon substrate 10. The slot is then filled with a filler material 16 such as polysilicon and then planarized.

Direct contact between the silicon substrate and the isolation oxide may result in damage to the substrate through thermal coefficient mismatch between the single crystal silicon substrate and the silicon oxide formed thereon which can, in turn, result in damage to the active devices formed in the silicon substrate.

Furthermore, growing thick layers of silicon dioxide thermally can cause significant stress in regions where the silicon forms acute corners since the oxide requires more volume than the silicon from which it was created.

The invention comprises the separation of the silicon substrate from the isolation oxide material in the isolation slot by at least a layer of a buffer material. In a preferred embodiment the buffer layer comprises polysilicon which is then partially oxidized to form the isolation oxide layer. To insulate the silicon substrate from the polysilicon layer to avoid shorts or other undesirable ohmic contacts occasioned by the presence of the polysilicon, a barrier layer of an insulation material is first placed between the walls of the slot and the polysilicon buffer layer.

After oxidation of part of the polysilicon buffer layer to form the isolation oxide, the remainder of the slot is filled with a filler material which conveniently may be polysilicon. The structure is then planarized.

Figure 2:
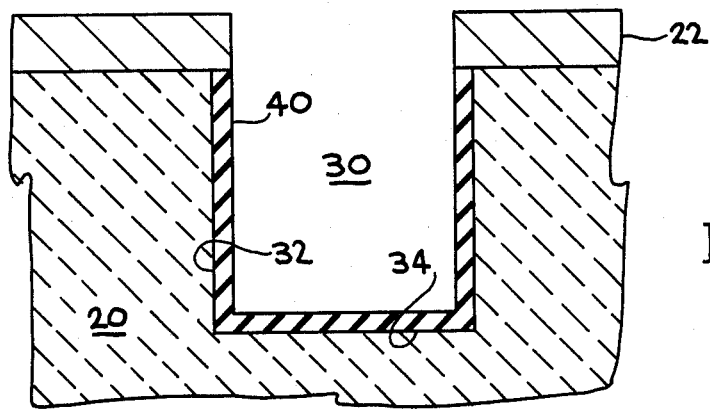
FIG. 2 is a fragmentary vertical cross-sectional view showing the first step of forming the isolation slot of the invention.

To form the isolation slot of the invention, a mask 22 is formed on the integrated circuit structure 20 and a slot 30 is anisotropically etched therethrough (with some degree of isotropicity if desired) as shown in FIG. 2: Mask 22 may comprise any convenient mask material such as, for example, a nitride mask. Slot 30 is anisotropically etched using, for example, a reactive ion each as is well known to those skilled in the art.

In a preferred embodiment, a barrier layer 40 is then formed on the sidewalls 32 and the bottom wall 34 of slot 30. This layer acts as an electrical barrier or insulator between the wall of the slot and a subsequent buffer layer as will be explained below. The use of the term 'wall' to describe the edges of the slot hereinafter will be understood to include the sidewalls 32 as well as the bottom wall 34.

Barrier layer 40 may comprise any convenient and economically applied insulating material such as, for example, an oxide or a nitride material. The thickness of the tarrier layer should be sufficient to provide the desired electrical insulation needed if a conducting or semi insulating material is used for the buffer layer as will be presently described. Preferably barrier layer 40 is at least about 300 to 1000 Angstroms thick. It is, however, possible to omit this barrier layer if the leakage between devices is not an issue or the leakage is made unsignificant due to the proper choice of doping of the buffer layer or by other means.

Figure 3:
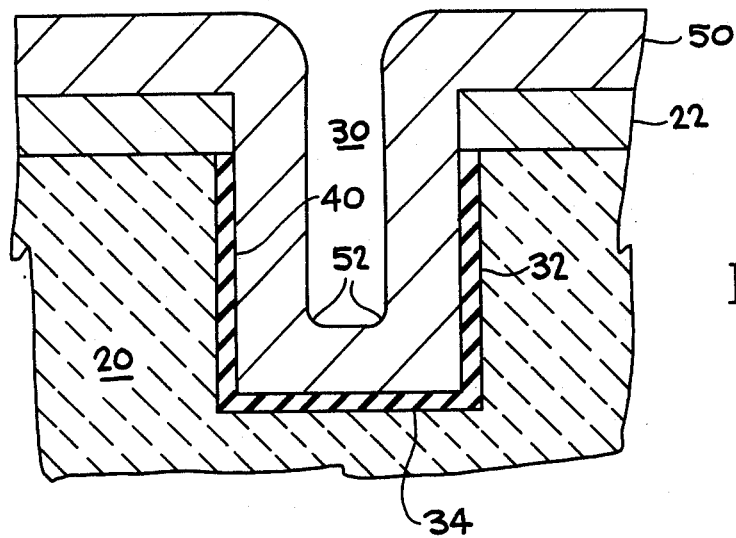
FIG. 3 is a fragmentary vertical cross-sectional view showing the second step of forming the isolation slot of the invention.

Turning now to FIG. 3, a buffer layer 50 is now formed on the walls of slot 30 to provide an intermediate layer between the silicon slot walls and the silicon oxide electrical isolation layer to be subsequently formed. Buffer layer 50 provides a thermal and mechanical interface whereby differences in thermal coefficients of expansion between the single crystal silicon substrate and the silicon oxide isolation layer will not result in the formation of mechanical or other stresses which can, in turn, cause damage to the substrate and to the active devices formed therein, i.e., transistors, diodes, resistors. Furthermore, as shown at 52, buffer layer 50 forms rounded corners whereby the subsequent formation of the isolation oxide by thermal growth of silicon oxide, when, for example, buffer layer 50 comprises polysilicon, will not result in formation of stress due to the larger volume occupied by silicon oxide than the polysilicon from which it was grown.

Buffer layer 50 comprises a deposit of a layer of material over barrier layer 40. Matarials such as polysilicon or germanium may be used to form buffer layer 50. Polysilicon is a particularly preferred material for use in forming buffer layer 50 due to its compatability with other materials used in the construction of the integrated circuit structure as well as the convenience of using such a material as a source for formation of the isolation oxide as will be described. However, as previously alluded to, unless other compensating measures are taken, the use of a conducting or semi insulating material such as polysilicon for the buffer layer may require the use of barrier layer 40 due to the conductivity of polysilicon which could result in undesirable ohmic contacts and resultant shorting if the polysilicon buffer layer were to be placed in direct electrical contact with the silicon substrate.

Buffer layer 50 comprises a layer of polysilicon or other suitable material having a thickness of from about 2000 Angstroms to a micron, preferably about 3000 to 5000 Angstroms, and most preferably about 3500 to 4500 Angstroms.

Figure 4:
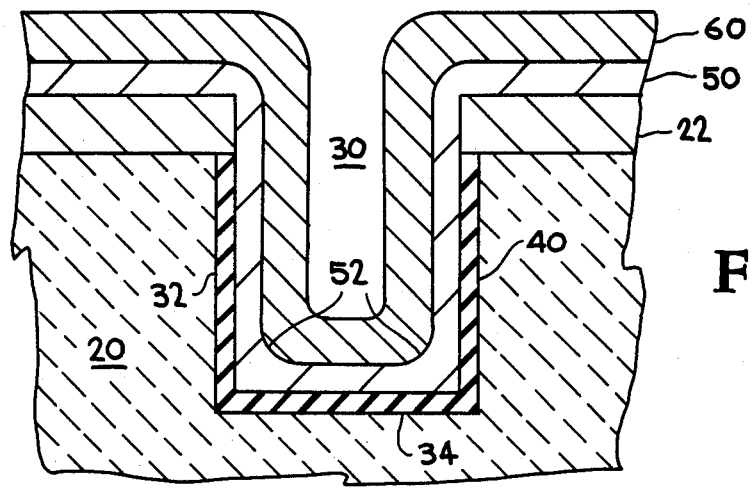
FIG. 4 is a fragmentary vertical cross-sectional view showing the third step of forming the isolation slot of the invention.

Isolation oxide layer 60 is preferably formed in slot 30 on buffer layer 50 by oxidizing a portion of polysilicon layer 50, as shown in FIG. 4, to form a layer of from at least 2000 Angstroms to as much as 6000 Angstroms or more of oxide, preferably at least 3000 Angstroms, on the polysilicon buffer layer. The amount of oxidation must be sufficient to provide the desired amount of electrical insulation and capacitance while still leaving sufficient polysilicon remaining in accordance with the invention, to provide the required interface between the silicon substrate 10 and the isolation oxide layer 60 as previously described. The amount of polysilicon in buffer layer 50 after the oxidation step should comprise at least from about 500 to 1000 Angstroms to insure an adequate interface or buffer layer in accordance with the invention.

Figure 5:
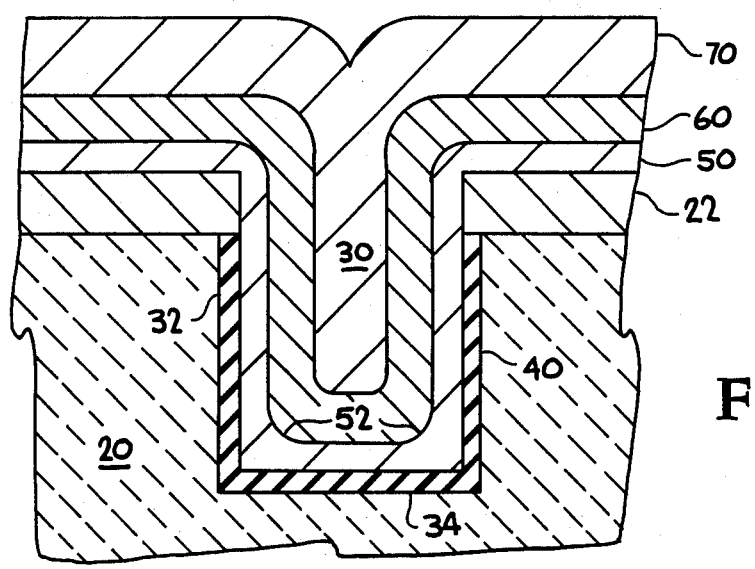
FIG. 5 is a fragmentary vertical cross-sectional view showing the fourth step of forming the isolation slot of the invention.

After formation of isolation oxide layer 60, the remainder of slot 30 is filled with any convenient and compatible filler material 70 which will permit subsequent planarization of the integrated circuit structure. In a preferred embodiment, the remainder of slot 30 is filled by further deposition of sufficient polysilicon filler material 70 as shown in FIG. 5.

Figure 6:
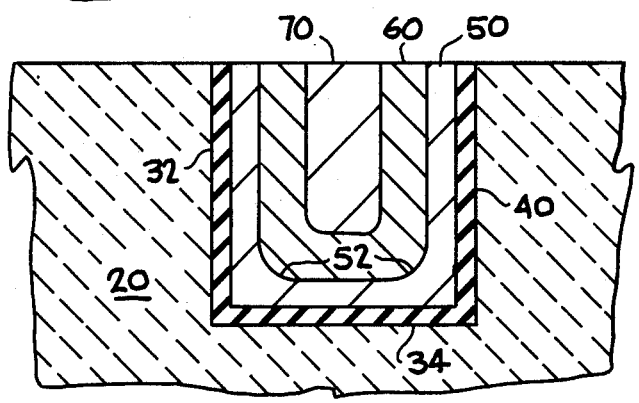
FIG. 6 is a fragmentary vertical cross-sectional view showing the fifth step of forming the isolation slot of the invention.

Finally, as shown in FIG. 6, the structure is subjected to a planarization step to provide the desired profile of the integrated circuit structure needed for further processing. This step may comprises conventional etching of materials as is well known to those skilled in the art.

Thus, the invention provides an improved isolation slot for use in integrated circuit structures to provide a buffer layer between the silicon substrate and the isolation oxide in the slot to inhibit damage to the silicon substrate and active devices formed therein.

Having thus described the invention, what is claimed is:

1. A method of making an improved isolation slot in an integrated circuit structure while minimizing damage to the silicon substrate which comprises:

(a) etching a slot in the substrate of an integrated circuit structure;

(b) depositing a polysilicon expansion buffer layer in said slot adjacent the walls of said slot; and (c) forming an isolation oxide layer in said slot over said buffer layer of sufficient thickness to provide an electrically insulating isolation layer in said slot;

whereby the presence of said expansion buffer layer minimizes damage to said substrate by said electrically insulating isolation oxide.

2. The method of claim 1 including the further step of forming an insulating oxide barrier layer on the walls of said slot prior to depositing said expansion buffer layer in said slot.

3. The method of claim 2 wherein said step of depositing said buffer layer in said slot comprises depositing a layer of polysilicon on said barrier layer whereby said barrier layer provides electrical isolation of said silicon substrate from said polysilicon buffer layer.

4. The method of claim 3 wherein said isolation oxide step comprises oxidizing a portion of said polysilicon buffer layer.

5. A method of making an improved isolation slot in an integrated circuit structure while minimizing damage to the silicon substrate which comprises:

(a) forming a slot in an integrated circuit structure;

(b) forming an electrically insulating barrier layer on the walls of said slot selected from the class consisting of oxide and nitride materials;

(c) depositing an expansion buffer layer of polysilicon over said barrier layer;

(d) oxidizing a portion of said buffer polysilicon layer to form an oxide layer of sufficient thickness to function as an isolation oxide layer; and (e) depositing a sufficient amount of a filler material into the remainder of said slot to fill up said slot;

whereby said expansion buffer layer of polysilicon protects said silicon substrate from damage caused by said isolation oxide layer.

6. The method of claim 5 wherein said step of forming said slot comprises the steps of masking said structure and then etching said structure through an opening of from 1 to 2 microns width in said mask to form said slot.

7. The method of claim 6 wherein said etching step comprises a reactive ion etch.

8. The method of claim 7 wherein said slot is etched to a depth of from 4 to 10 microns.

9. The method of claim 8 wherein said masking step comprises forming a nitride mask on said structure.

10. The method of claim 5 wherein said step of forming a barrier layer comprises growing a layer of silicon oxide on the walls of said slot.

11. The method of claim 10 wherein said step of growing a barrier oxide layer comprises growing a layer of oxide at least 300 to 1000 Angstroms thick.

12. The method of claim 5 wherein said step of forming a barrier layer comprises forming a barrier layer of silicon nitride on the walls of said slot.

13. The method of claim 12 wherein said step of forming a silicon nitride barrier layer comprises forming a silicon nitride layer at least 300 to 1000 Angstroms thick.

14. The method of claim 5 wherein said step of depositing a buffer layer of polysilicon comprises depositing from about 2000 Angstroms to about 1 micron of polysilicon on the walls of said slot.

15. The method of claim 14 wherein said polysilicon oxidation step comprises oxidizing a sufficient amount of said polysilicon to form from at least 2000 Angstroms of oxide on said polysilicon to form an isolation oxide layer in said slot.

16. The method of claim 15 wherein said isolation oxide layer is formed to a thickness of from 3000 to 6000 Angstroms.

17. The method of claim 16 wherein said step of depositing filler material into the remainder of said slot comprises depositing, over said isolation oxide layer, a sufficient amount of polysilicon to fill up said slot.

18. The method of claim 17 wherein said integrated circuit structure having said filled slot is then subjected to a planarization step.

19. A method of forming an improved isolation slot in an integrated circuit structure while minimizing damage to the structure which comprises:

(a) masking the integrated circuit structure to form an opening having a width of 1 to 2 microns between adjacent active devices;

(b) etching through said opening to a depth of 4 to 10 microns to form said isolation slot;

(c) forming a 300 to 1000 Angstrom thick insulating barrier layer on the walls of said slot comprising a barrier material selected from the class consisting of silicon oxide and silicon nitride;

(d) depositing a 3000 Angstrom to 1 micron thick layer of polysilicon over said barrier layer to provide an expansion buffer layer;

(e) oxidizing a sufficient amount of said polysilicon layer to form at least 3000 Angstroms of an isolation oxide layer over said polysilicon layer while leaving a 500 to 1000 Angstrom layer of buffer layer of polysilicon between said barrier layer and said isolation oxide layer; and (f) filling the remainder of said slot with a filler material to permit subsequent planarization of said integrated circuit structure.

* * * * *